United States Patent
Lin

(10) Patent No.: US 8,536,601 B2
(45) Date of Patent: *Sep. 17, 2013

(54) THIN-FILM LED WITH P AND N CONTACTS ELECTRICALLY ISOLATED FROM THE SUBSTRATE

(75) Inventor: Chao-Kun Lin, Livermore, CA (US)

(73) Assignee: Toshiba Techno Center, Inc., Tokyo (JP)

(*) Notice: Subject to any disclaimer, the term of this patent is extended or adjusted under 35 U.S.C. 154(b) by 53 days.

This patent is subject to a terminal disclaimer.

(21) Appl. No.: 12/835,632

(22) Filed: Jul. 13, 2010

(65) Prior Publication Data

US 2010/0314651 A1    Dec. 16, 2010

Related U.S. Application Data

(62) Division of application No. 12/482,413, filed on Jun. 10, 2009, now Pat. No. 8,207,547.

(51) Int. Cl.
*H01L 33/00* (2010.01)

(52) U.S. Cl.
USPC .............. 257/98; 257/E33.062; 257/E33.063; 257/E33.064; 257/E33.065; 257/E33.066; 257/E33.067; 257/E33.068

(58) Field of Classification Search
USPC .............................. 257/98, E33.062–E33.068
See application file for complete search history.

(56) References Cited

U.S. PATENT DOCUMENTS

| | | | |
|---|---|---|---|
| 5,306,662 | A | 4/1994 | Nakamura et al. |
| 5,408,120 | A | 4/1995 | Manabe et al. |
| 5,468,678 | A | 11/1995 | Nakamura et al. |
| 5,563,422 | A | 10/1996 | Nakamura et al. |
| 5,578,839 | A | 11/1996 | Nakamura et al. |
| 5,734,182 | A | 3/1998 | Nakamura et al. |
| 5,747,832 | A | 5/1998 | Nakamura et al. |
| 5,753,939 | A | 5/1998 | Sassa et al. |
| 5,777,350 | A | 7/1998 | Nakamura et al. |
| 5,959,307 | A | 9/1999 | Nakamura et al. |
| 5,959,401 | A | 9/1999 | Asami et al. |
| 6,005,258 | A | 12/1999 | Manabe et al. |
| 6,040,588 | A | 3/2000 | Koide et al. |
| RE36,747 | E | 6/2000 | Manabe et al. |
| 6,215,133 | B1 | 4/2001 | Nakamura et al. |
| 6,265,726 | B1 | 7/2001 | Manabe et al. |
| 6,326,236 | B1 | 12/2001 | Koide et al. |
| 6,420,733 | B2 | 7/2002 | Koide et al. |

(Continued)

FOREIGN PATENT DOCUMENTS

| | | |
|---|---|---|
| JP | 2626431 | 5/1994 |
| JP | 2681733 | 5/1994 |

(Continued)

OTHER PUBLICATIONS

PCT/US2010/036784—Notification of transmittal of the international search report and the written opinion of the international searching authority, or the declaration.Jul. 28, 2010.

(Continued)

*Primary Examiner* — Jarrett Stark
(74) *Attorney, Agent, or Firm* — Hogan Lovells US LLP

(57) ABSTRACT

A thin-film LED includes an insulating substrate, an electrode on the insulating substrate, and an epitaxial structure on the electrode.

17 Claims, 25 Drawing Sheets

(56) References Cited

U.S. PATENT DOCUMENTS

| | | | |
|---|---|---|---|
| 6,541,293 | B2 | 4/2003 | Koide et al. |
| 6,610,995 | B2 | 8/2003 | Nakamura et al. |
| 6,657,236 | B1 | 12/2003 | Thibeault et al. |
| 6,800,500 | B2 | 10/2004 | Coman et al. |
| 6,803,122 | B2 | 10/2004 | Shirakawa et al. |
| 6,838,693 | B2 | 1/2005 | Kozaki |
| 6,849,881 | B1 | 2/2005 | Harle et al. |
| 6,891,197 | B2 | 5/2005 | Bhat et al. |
| 6,906,352 | B2 | 6/2005 | Edmond et al. |
| 6,916,676 | B2 | 7/2005 | Sano et al. |
| 6,951,695 | B2 | 10/2005 | Xu et al. |
| 6,977,395 | B2 | 12/2005 | Yamada et al. |
| 7,026,653 | B2 | 4/2006 | Sun |
| 7,106,090 | B2 | 9/2006 | Harle et al. |
| 7,115,908 | B2 | 10/2006 | Watanabe et al. |
| 7,138,286 | B2 | 11/2006 | Manabe et al. |
| 7,193,246 | B1 | 3/2007 | Tanizawa et al. |
| 7,242,031 | B2 | 7/2007 | Sakai |
| 7,262,436 | B2 | 8/2007 | Kondoh et al. |
| 7,312,474 | B2 | 12/2007 | Emerson et al. |
| 7,335,920 | B2 | 2/2008 | Denbaars et al. |
| 7,345,297 | B2 | 3/2008 | Yamazoe et al. |
| 7,348,602 | B2 | 3/2008 | Tanizawa |
| 7,402,838 | B2 | 7/2008 | Tanizawa et al. |
| 7,442,966 | B2 | 10/2008 | Bader et al. |
| 7,446,345 | B2 | 11/2008 | Emerson et al. |
| 7,491,565 | B2 | 2/2009 | Coman et al. |
| 7,547,908 | B2 | 6/2009 | Grillot et al. |
| 7,611,917 | B2 | 11/2009 | Emerson et al. |
| 7,709,851 | B2 | 5/2010 | Bader et al. |
| 7,737,459 | B2 | 6/2010 | Edmond et al. |
| 7,754,514 | B2 | 7/2010 | Yajima et al. |
| 7,791,061 | B2 | 9/2010 | Edmond et al. |
| 7,791,101 | B2 | 9/2010 | Bergmann et al. |
| 7,910,945 | B2 | 3/2011 | Donofrio et al. |
| 7,939,844 | B2 | 5/2011 | Hahn et al. |
| 7,947,994 | B2 | 5/2011 | Tanizawa et al. |
| 8,021,904 | B2 | 9/2011 | Chitnis |
| 8,030,665 | B2 | 10/2011 | Nagahama et al. |
| 2003/0010975 | A1* | 1/2003 | Gibb et al. ............ 257/40 |
| 2004/0104393 | A1 | 6/2004 | Liu et al. |
| 2005/0224822 | A1* | 10/2005 | Liu ............ 257/84 |
| 2009/0134420 | A1 | 5/2009 | Nagai |
| 2009/0233236 | A1* | 9/2009 | Black et al. ............ 430/311 |

FOREIGN PATENT DOCUMENTS

| | | |
|---|---|---|
| JP | 2917742 | 6/1994 |
| JP | 2827794 | 8/1994 |
| JP | 2778405 | 9/1994 |
| JP | 2803741 | 9/1994 |
| JP | 2785254 | 1/1995 |
| JP | 2956489 | 3/1996 |
| JP | 2666237 | 4/1996 |
| JP | 2735057 | 9/1996 |
| JP | 2890396 | 12/1996 |
| JP | 3250438 | 12/1996 |
| JP | 3135041 | 6/1997 |
| JP | 3209096 | 12/1997 |
| JP | 3506874 | 1/1998 |
| JP | 3654738 | 2/1998 |
| JP | 3795624 | 2/1998 |
| JP | 3304787 | 5/1998 |
| JP | 3344257 | 8/1998 |
| JP | 3223832 | 9/1998 |
| JP | 3374737 | 12/1998 |
| JP | 3314666 | 3/1999 |
| JP | 4118370 | 7/1999 |
| JP | 4118371 | 7/1999 |
| JP | 3548442 | 8/1999 |
| JP | 3622562 | 11/1999 |
| JP | 3424629 | 8/2000 |
| JP | 4860024 | 8/2000 |
| JP | 3063756 | 9/2000 |
| JP | 4629178 | 9/2000 |
| JP | 3063757 | 10/2000 |
| JP | 3511970 | 10/2000 |
| JP | 3551101 | 5/2001 |
| JP | 3427265 | 6/2001 |
| JP | 3646649 | 10/2001 |
| JP | 3780887 | 5/2002 |
| JP | 3890930 | 5/2002 |
| JP | 3786114 | 4/2004 |
| JP | 4904261 | 3/2012 |
| KR | 100900288 | 5/2009 |
| TW | 561630 | 11/2003 |
| TW | 200908369 | 2/2009 |
| TW | 200913307 | 3/2009 |

OTHER PUBLICATIONS

Office action dated Feb. 4, 2013 from related Taiwan Application No. 99118138.

Office action dated Nov. 27, 2012 from related Korean Application No. No. 2012-7000661.

S.J. Chang et al.; Nitride-based LEDs with a hybrid Al mirror TiO2/SiO2 DBR backside reflector; Journal of lightwave technology, Sep. 1, 2008; vol. 26, pp. 3131-3136; IEEE.

* cited by examiner

THIN-FILM LED WITH P AND N CONTACTS ELECTRICALLY ISOLATED FROM THE SUBSTRATE

CROSS-REFERENCE TO RELATED APPLICATION(S)

This is a Divisional Application which claims the benefit of pending U.S. patent application Ser. No. 12/482,413, filed on Jun. 10, 2009 and to co-pending U.S. Divisional patent application Ser. No. 12/790,597, filed on May 28, 2010. The disclosure of the prior application is hereby incorporated herein in its entirety by reference.

BACKGROUND

1. Field

The present disclosure relates to a thin-film light emitting diode (LED) and, more particularly, to a thin-film LED with p and n contacts electrically isolated from the substrate.

2. Background

LEDs have been developed for many years and have been widely used in various light applications. As LEDs are lightweight, consume less energy, and have a good electrical power to light conversion efficiency, they have been used to replace conventional light sources, such as incandescent lamps and fluorescent light sources. However, there is still a need in the art to improve the performance characteristics of LEDs.

SUMMARY

In one aspect of the disclosure, a thin-film LED includes an insulating substrate, an electrode on the insulating substrate, and an epitaxial structure on the electrode.

In another aspect of the disclosure, a thin-film LED includes a substrate, an insulating dielectric film layer on the substrate, an electrode on the insulating dielectric film layer, and an epitaxial structure on the electrode.

In yet another aspect of the disclosure, a method of manufacturing a thin-film light emitting diode includes forming an epitaxial structure on a growth substrate. The epitaxial structure includes a first epitaxial layer, a second epitaxial layer, and an active region between the first epitaxial layer and the second epitaxial layer. The method further includes forming an electrode layer on the second epitaxial layer of the epitaxial structure, attaching/bonding a host substrate with a conductive adhesive layer to the electrode layer, removing the growth substrate, and removing part of (or etching) the epitaxial structure to form a mesa with the epitaxial structure and to expose at least one of the second epitaxial layer or the electrode layer.

It is understood that other aspects of a thin-film LED will become readily apparent to those skilled in the art from the following detailed description, wherein it is shown and described only exemplary configurations of a coplanar thin-film LED. As will be realized, the invention includes other and different aspects of a coplanar thin-film LED and the various details presented throughout this disclosure are capable of modification in various other respects, all without departing from the spirit and scope of the invention. Accordingly, the drawings and the detailed description are to be regarded as illustrative in nature and not as restrictive.

DETAILED DESCRIPTION

Figure 1:
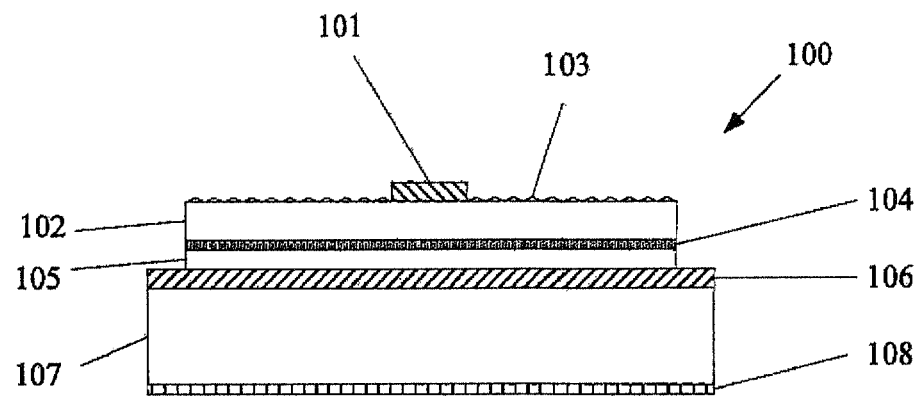
FIG. 1 is a cross-sectional view of a vertical thin-film LED.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can therefore encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various aspects of a thin-film LED may be illustrated with reference to one or more exemplary configurations. A thin-film LED is an LED that is deposited onto a substrate in thin material layers. Thin-film refers to a technology and is not restricted to any particular thickness for each layer. As used herein, the term "exemplary" means "serving as an example, instance, or illustration," and should not necessarily be construed as preferred or advantageous over other configurations of a coplanar thin-film LED disclosed herein.

Furthermore, various descriptive terms used herein, such as "on" and "transparent," should be given the broadest meaning possible within the context of the present disclosure. For example, when a layer is said to be "on" another layer, it should be understood that that one layer may be deposited, etched, attached, or otherwise prepared or fabricated directly or indirectly above or below that other layer. In addition, something that is described as being "transparent" should be understood as having a property allowing no significant obstruction or absorption of electromagnetic radiation in the particular wavelength (or wavelengths) of interest, unless a particular transmittance is provided.

Figure 2:
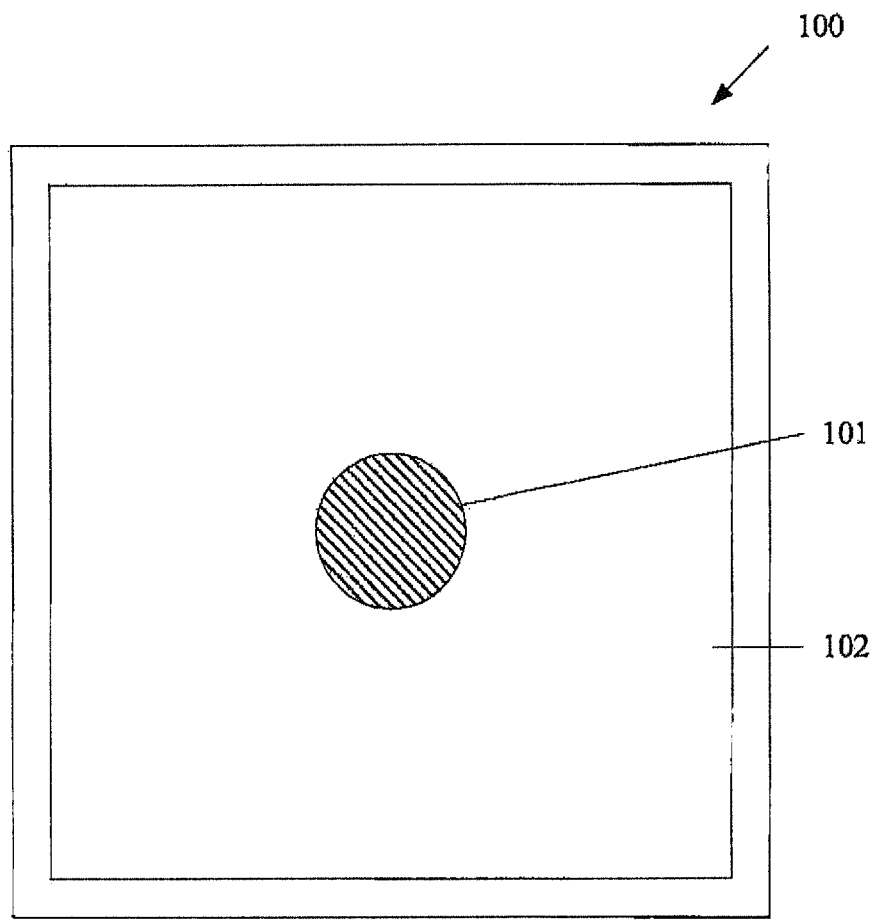
FIG. 2 is a top view of the vertical thin-film LED of FIG. 1.

FIG. 1 is a cross-sectional view of a small vertical thin-film LED 100. FIG. 2 is a top view of the small vertical thin-film LED 100 of FIG. 1. The vertical LED device 100 has a vertical current injection configuration including a patterned n-type contact/electrode (top contact) 101, an n-type gallium nitride based ("GaN-based") layer 102 with a roughened surface 103, an active region 104, a p-type GaN-based layer 105, a broad area reflective p-type contact/electrode 106, a thermally and electrically conductive substrate 107 to support the device structure mechanically, and a metal bottom contact 108. The n-type GaN-based layer 102 is formed on a growth substrate (not shown) and the active region 104 is formed between the n-type GaN-based layer 102 and the p-type GaN-based layer 105. The p-type electrode 106 is directly or indirectly formed on the p-type GaN-based layer 105. The growth substrate on which the n-type GaN-based layer 102 is removed so that the patterned n-type electrode 101 can be formed on the surface of the n-type GaN-based layer 102 that was attached to the growth substrate.

Figure 3:
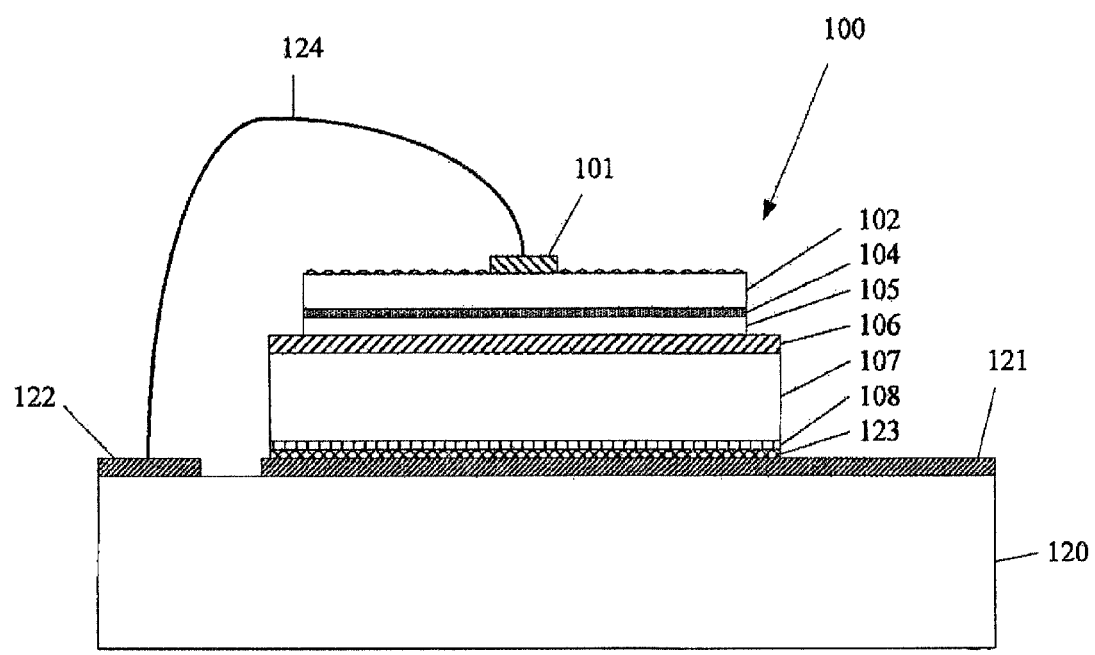
FIG. 3 is a cross-sectional view of the vertical thin-film LED of FIG. 1 mounted on a sub-mount.

FIG. 3 is a cross-sectional view of the vertical thin-film LED 100 mounted on a sub-mount. To package the thin-film LEDs, the LEDs are mounted on an insulating ceramic sub-mount 120 with a p-pad 121 and an n-pad 122. The bottom contact 108 (p-contact) of the LED is attached to the p-pad 121 using conductive epoxy, solder, or eutectic 123. The top contact 101 (n-contact) is connected to the n-pad 122 with bonding wires 124.

As the n-type GaN-based layer 102 and the p-type GaN-based layer 105 are opposite to each other, together they form a carrier injector relative to the active region 104. Therefore, when a voltage potential is provided between the bottom contact 108 and the top contact 101 of the LED device 100, an electrical path is formed vertically from the bottom contact 108 to the top contact 101. Consequently, holes that are injected from the p-type GaN-based layer 105 to the active region 104 and electrons that are injected from the n-type GaN-based layer 102 to the active region 104 recombine in the active region 104, thereby releasing energy in a form of light.

Thermal conductivity of the low cost (the thermal conductivities of ceramic AlN or SiC are greater at 120 W/mK, but they are expensive) insulating ceramic sub-mount 120 is usually quite low (less than 40 W/mK), and the heat generated in the high power LED cannot be dissipated efficiently through the ceramic sub-mount, which limits the maximum drivability of the packaged LEDs. On the other hand, the thermal conductivity of metal sub-mounts (e.g., Al, Cu) is relatively high (238 W/mK for Al, 398 W/mK for Cu) and they are ideal for minimizing the rise of LED junction temperature at high drive current condition. The drawback of using a metallic sub-mount for thin-film LED arrays is that the p-contacts of the thin film LEDs will all be connected via the metallic sub-mount. The thin-film LEDs in an array cannot be connected in series on a metallic sub-mount unless a layer of insulating film and patterned metal traces are inserted between the LED and the metallic sub-mount to isolate the individual LED. However, because the layer of insulating film has a low thermal conductivity and must be relatively thick, the effective thermal resistance between the junction of the LED and the metallic sub-mount is increased and the purpose of using a metallic sub-mount for packaging LEDs is compromised.

Figure 4:
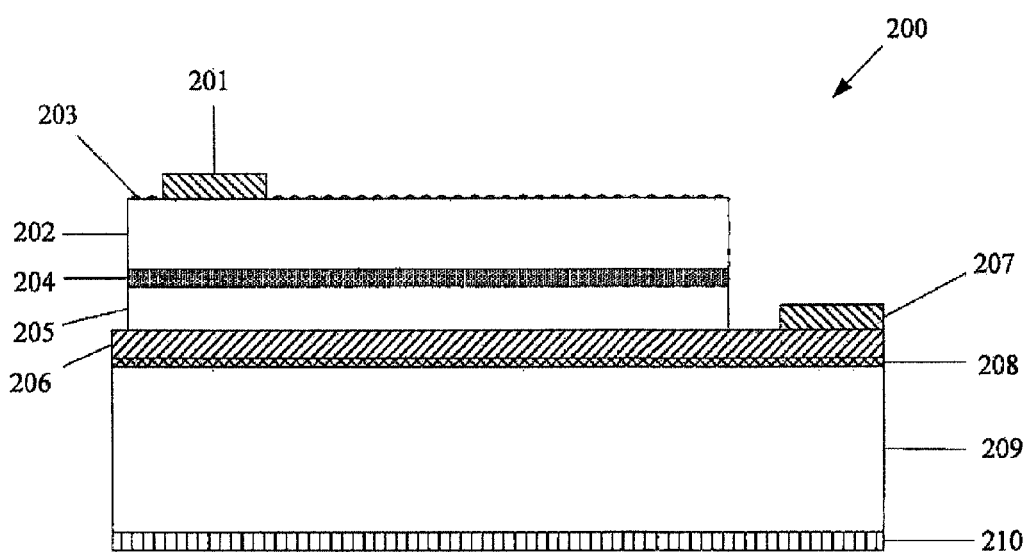
FIG. 4 is a cross-sectional view of a coplanar thin-film LED according to a first configuration.

FIG. 4 is a cross-sectional view of a first configuration of a coplanar thin-film LED 200. The LED device 200 includes a patterned n-type contact/electrode 201, an n-type GaN-based layer 202 with a roughened surface 203, an active region 204, a p-type GaN-based layer 205, a reflective p-type contact/electrode 206, a p-contact 207, a conductive adhesive layer 208, an insulating substrate 209, and a metalized bottom surface 210. The metal p-type electrode 206 and the conductive adhesive layer 208 are thick enough to spread the current for the p-type GaN-based layer 205 and together may have a thickness greater than about 1 um. The conductive adhesive layer 208 may be eutectic metal, solder metal, silver epoxy, or another type of conductive adhesive. In an LED array, it is important to be able to connect LEDs in parallel and/or in series to match the LED driver's voltage and/or current. As such, to avoid using a thermally resistive insulating film between the thin-film LEDs and a metallic sub-mount, the p-contact 207 and the n-contact 201 are on the same side of the LED 200 (i.e., they are coplanar) and are electrically isolated from the substrate 209. The substrate 209 is an electrically insulated or resistive substrate (i.e., an insulator, a dielectric, and/or a substance the resists the flow of electric current) and may be formed of $Al_2O_3$, high resistivity Si, semi-insulating GaAs, or InP. In one configuration, the substrate 209 may be transparent for the wavelengths between about 300 nm to 700 nm with a transmittance greater than about 50% (e.g., crystalline form of $Al_2O_3$, SiC, and AlN). The transmittance may be at least 60% for blue and yellow light. In packaged LEDs or LED arrays, some light rays inevitably are reflected from the silicone/air interface, reflector cup, phosphor particles and neighboring dies, and enter the transparent substrate 209. The interface between 208/209 and 210/209 may have reflectance greater than 60% to redirect the strayed light rays to escape the substrate 209. In another configuration, the substrate 209 may be reflective for the wavelength between about 300 nm and 700 nm with a reflectance greater than about 50% (e.g., ceramic/amorphous form of $Al_2O_3$). The metalized bottom surface 210 allows the LED device 200 to be attached to the metallic sub-mount.

Figure 5:
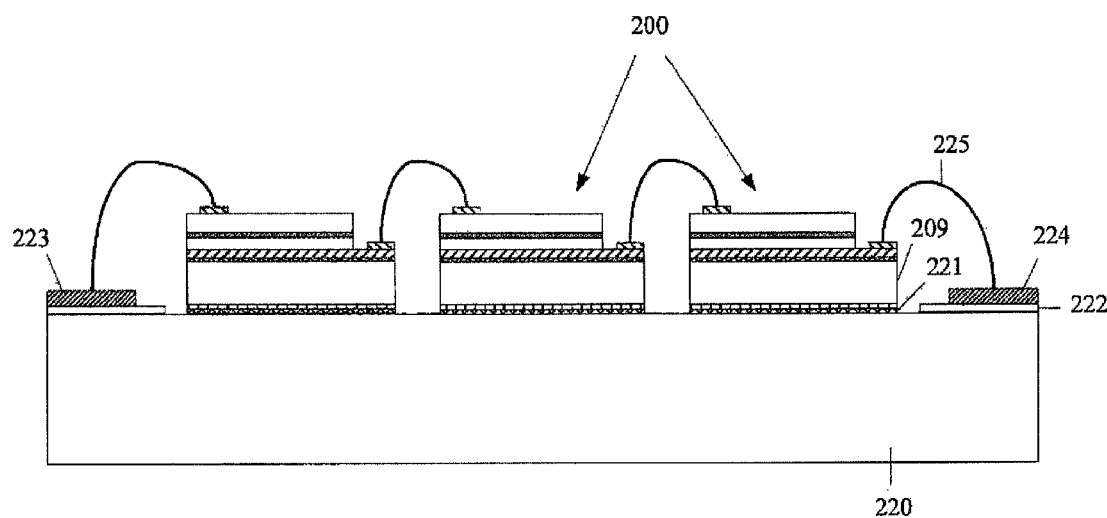
FIG. 5 is a cross-sectional view of a plurality of the coplanar thin-film LEDs of the first configuration mounted in series on a metallic sub-mount.

FIG. 5 is a cross-sectional view of a plurality of the coplanar thin-film LEDs 200 of the first configuration mounted in series on a metallic sub-mount 220. As shown in FIG. 5, the LEDs 200 may be mounted to the metallic sub-mount 220 with thermally conductive adhesives or eutectic solders 221 to minimize the thermal resistance between the insulating substrate 209 and the metallic sub-mount 220. The LEDs 200 are located such that the p and n contacts of the LEDs 200 are isolated from other devices in the array. The n-pad 223 and the p-pad 224 are mounted to the metallic sub-mount 220 with an intervening layer of insulating film 222 to insulate the n-pad 223 and the p-pad 224 from being electrically coupled to the metallic sub-mount 220. Through connections with bonding wires 225, the LEDs can be connected in parallel or in series. As shown in FIG. 5, the LEDs 200 are connected in series.

Figure 6:
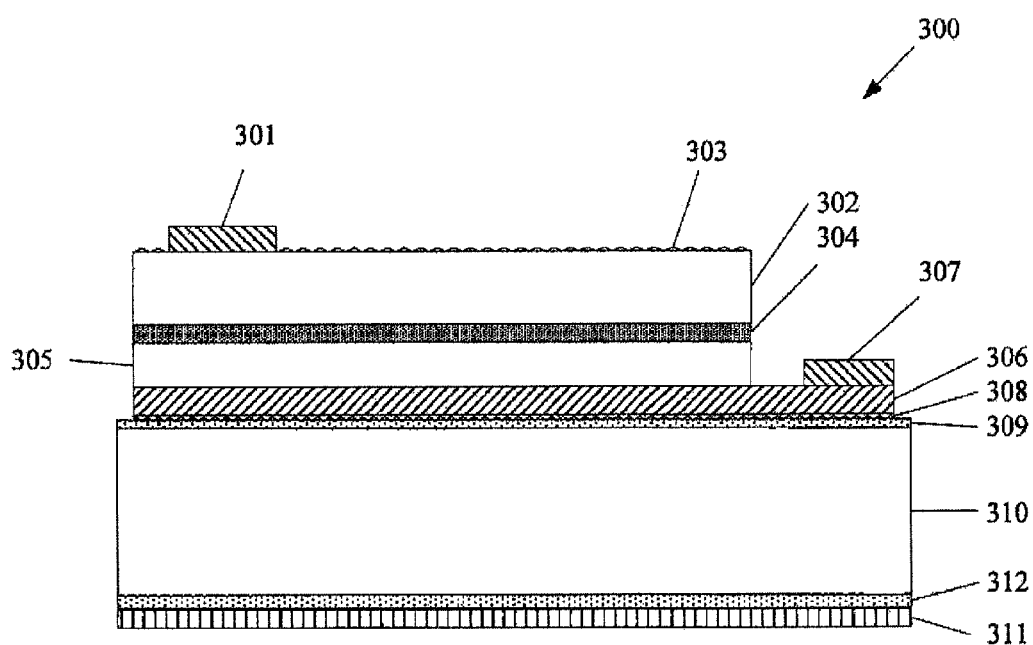
FIG. 6 is a cross-section view of a coplanar thin-film LED according to a second configuration.

FIG. 6 is a cross-section view of a coplanar thin-film LED 300 according to a second configuration. The LED device 300 includes a patterned n-type contact/electrode 301, an n-type GaN-based layer 302 with a roughened surface 303, an active region 304, a p-type GaN-based layer 305, a reflective p-type contact/electrode 306, a p-contact 307, a conductive adhesive layer 308, an insulating dielectric film layer 309, a substrate 310, and a metalized bottom surface 311. The metal p-type electrode 306 and the conductive adhesive layer 308 are thick enough to spread the current for the p-type GaN-based layer 305 and together may have a thickness greater than about 1 um. In an exemplary configuration, an additional insulating dielectric film layer 312 may be located between the substrate 310 and the metalized bottom surface 311. The substrate 310 may be an insulator or may be electrically conductive. In one configuration, the substrate 310 may be transparent for the wavelengths between about 300 nm to 700 nm with a transmittance greater than about 50%. The transmittance may be at least 60% for blue and yellow light. In another configuration, the substrate 310 may be reflective for the wavelength between about 300 nm and 700 nm with a reflectance greater than about 50%. The insulating dielectric film layer 309 insulates the substrate 310 from the p-type electrode 306. The insulating dielectric film layer 309 can be as thin as 0.1 um and has no impact on the thermal resistance of the LED device 300. In an exemplary configuration, the edge of the p-type electrode 306 is recessed from an edge of the chip to avoid metal debris shorting the p-contact 307 to the substrate 310 during the die singulation process.

Figure 7:
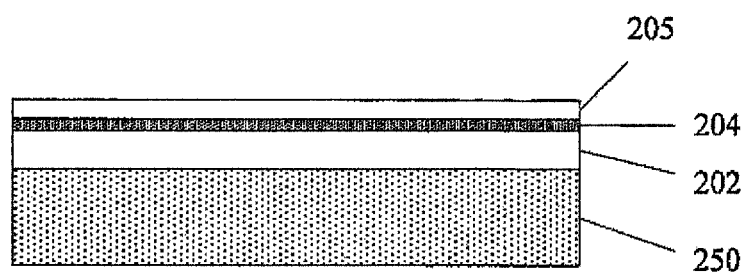
FIG. 7 is a first cross-sectional view showing a process of manufacture of the coplanar thin-film LED of the first configuration.
Figure 8:
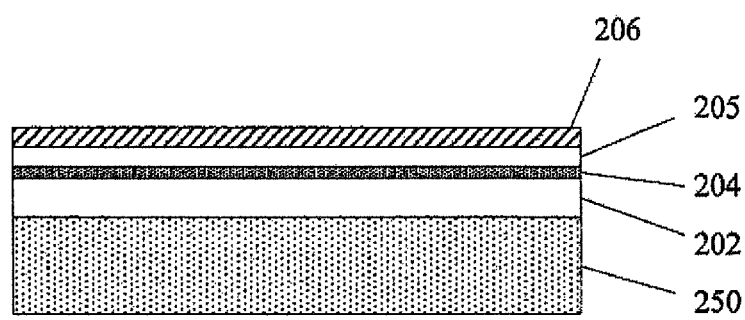
FIG. 8 is a second cross-sectional view showing the process of manufacture of the coplanar thin-film LED of the first configuration.
Figure 9:
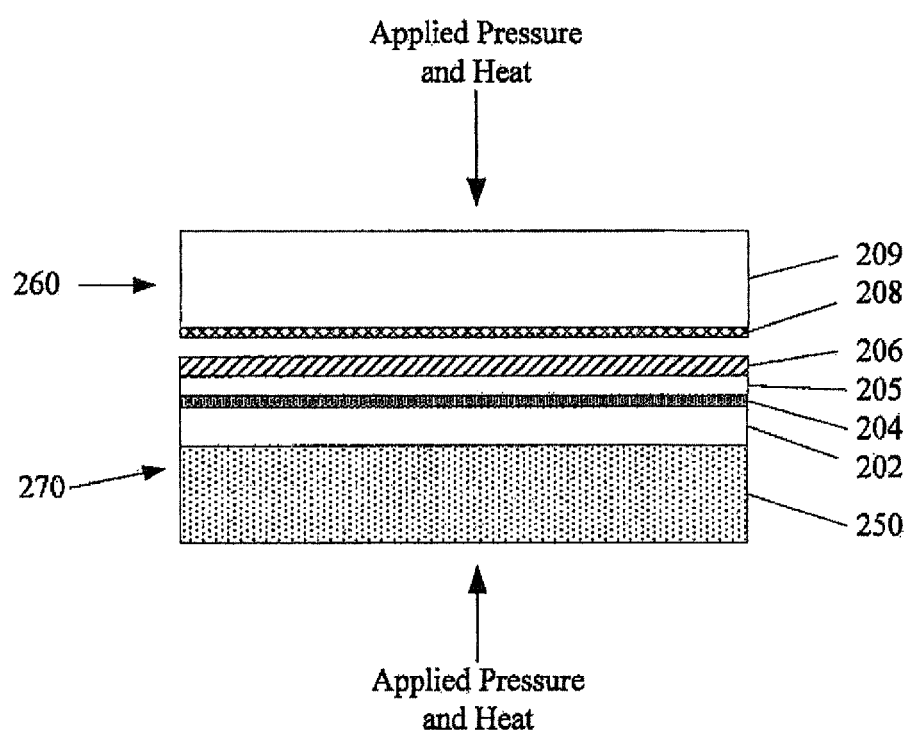
FIG. 9 is a third cross-sectional view showing the process of manufacture of the coplanar thin-film LED of the first configuration.

FIGS. 7-14 are cross-sectional views showing a process of manufacture of the coplanar thin-film LED of the first configuration. As shown in FIG. 7, an epitaxial structure including an n-type GaN-based layer 202, an active region 204, and a p-type GaN-based layer 205 are grown/formed on the sapphire (Al2O3) or silicon carbide (SiC) substrate 250. As shown in FIG. 8, a reflective p-type contact/electrode 206 with a capping layer (e.g., Au) is formed on the p-type GaN-based layer 205 to cover an entire surface of the p-type GaN-based layer 205. Subsequently, as shown in FIG. 9, in a wafer bonding process, an insulating substrate 209 with a conductive adhesive layer 208 is bonded through applied pressure to the reflective p-type electrode 206. The conductive adhesive layer 208 may be eutectic metal, solder metal, silver epoxy, or another type of conductive adhesive. Pressure is applied to put the two wafer surfaces 206, 208 in intimate contact. Heat may be provided to melt the conductive adhesive layer 208 to join the two wafers 260, 270 together.

Figure 10:
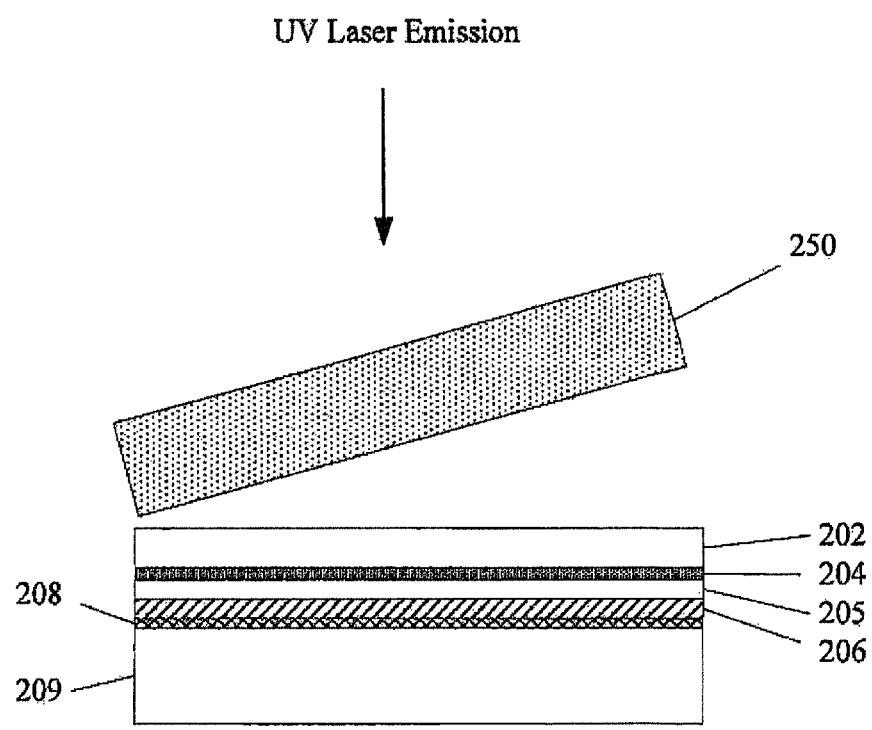
FIG. 10 is a fourth cross-sectional view showing the process of manufacture of the coplanar thin-film LED of the first configuration.
Figure 11:
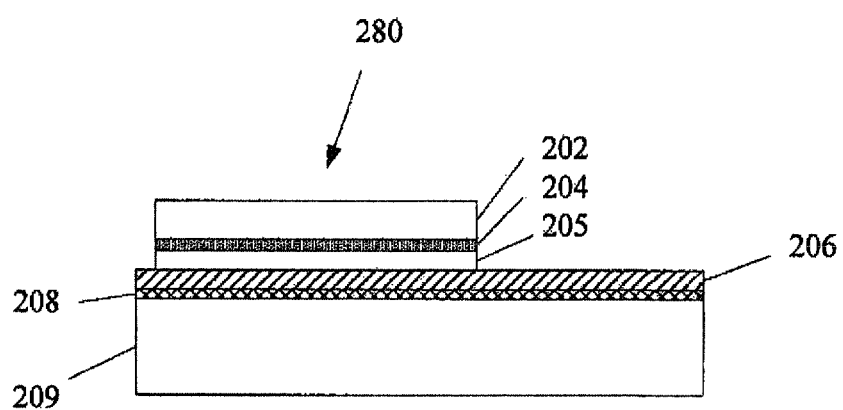
FIG. 11 is a fifth cross-sectional view showing the process of manufacture of the coplanar thin-film LED of the first configuration.
Figure 12:
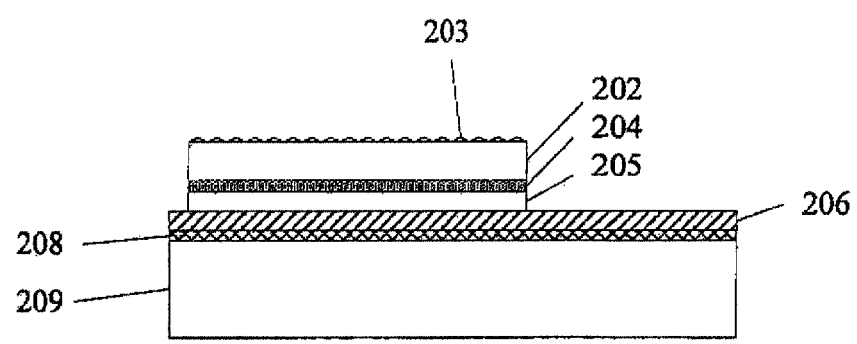
FIG. 12 is a sixth cross-sectional view showing the process of manufacture of the coplanar thin-film LED of the first configuration.
Figure 13:
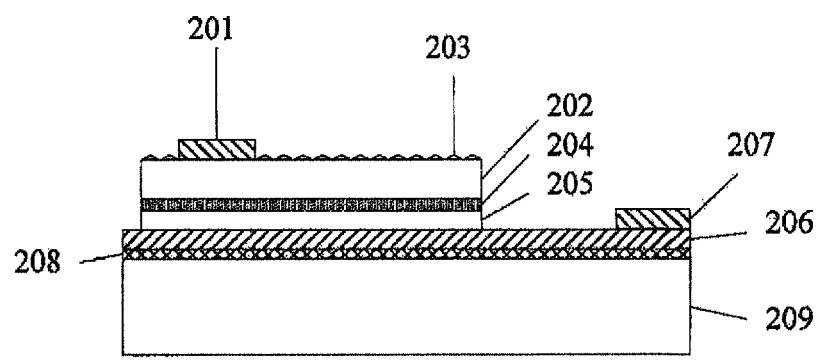
FIG. 13 is a seventh cross-sectional view showing the process of manufacture of the coplanar thin-film LED of the first configuration.
Figure 14:
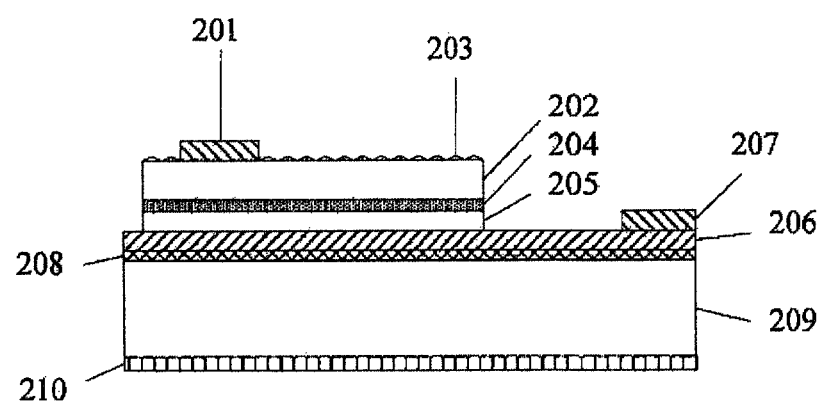
FIG. 14 is an eighth cross-sectional view showing the process of manufacture of the coplanar thin-film LED of the first configuration.

As shown in FIG. 10, the growth substrate 250 is removed. If the growth substrate 250 is a sapphire substrate, the growth substrate 250 may be removed through a laser lift-off (LLO) process in which a UV laser with a photon energy greater than the GaN band gap energy is applied. In an exemplary configuration, a UV laser with a wavelength of about 248 nm is used in the LLO process. If the growth substrate 250 is a SiC substrate, the growth substrate 250 may be removed through mechanical thinning and chemical etching. As shown in FIG. 11, a mesa 280 is formed by etching the epitaxial structure (i.e., the n-type GaN-based layer 202, active region 204, and the p-type GaN-based layer 205) to expose the reflective p-type electrode 206. As shown in FIG. 12, a surface of the n-type GaN-based layer 202 is roughened with wet chemistry efficiency to create micro-structures 203 for enhanced light extraction. In an exemplary configuration, the micro-structures 203 are between about 200 nm and 400 nm in size. In another exemplary configuration, the micro-structures 203 are between about 100 nm and 500 nm in size. As shown in FIG. 13, the n-contact 201 is formed on the n-type GaN-based layer 202 and the p-contact 207 is formed on the reflective p-type electrode 206. If the p-type electrode 206 is not fully exposed when the epitaxial structure is etched and a thin layer of the p-Type GaN-based layer 205 remains, the p-contact 207 may be formed on the exposed p-type GaN-based layer 205. The n-contact 201 and the p-contact 207 are metal and may be Cr, Ti, aluminum, platinum, Au or the like. Subsequently, the substrate 209 is thinned to a desired thickness and, as shown in FIG. 14, the metalized bottom surface 210 is deposited on a bottom surface of the substrate 209.

Figure 15:
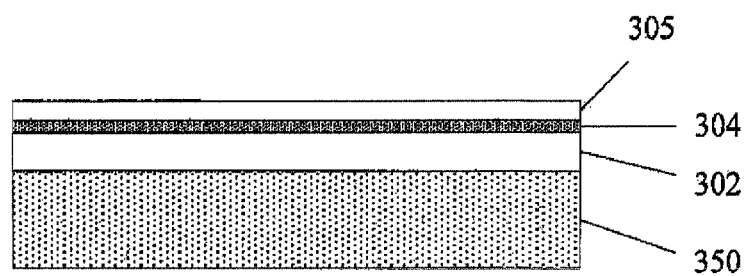
FIG. 15 is a first cross-sectional view showing a process of manufacture of the coplanar thin-film LED of the second configuration.
Figure 16:
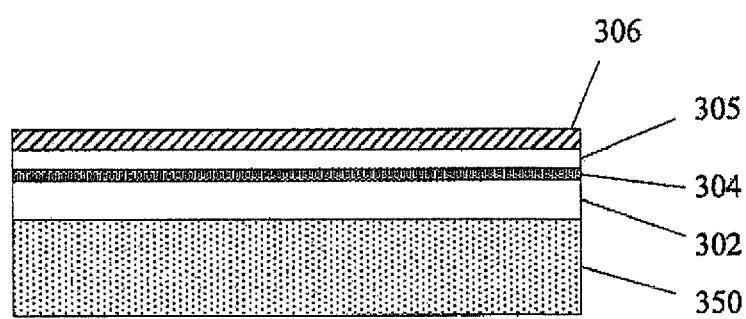
FIG. 16 is a second cross-sectional view showing the process of manufacture of the coplanar thin-film LED of the second configuration.
Figure 17:
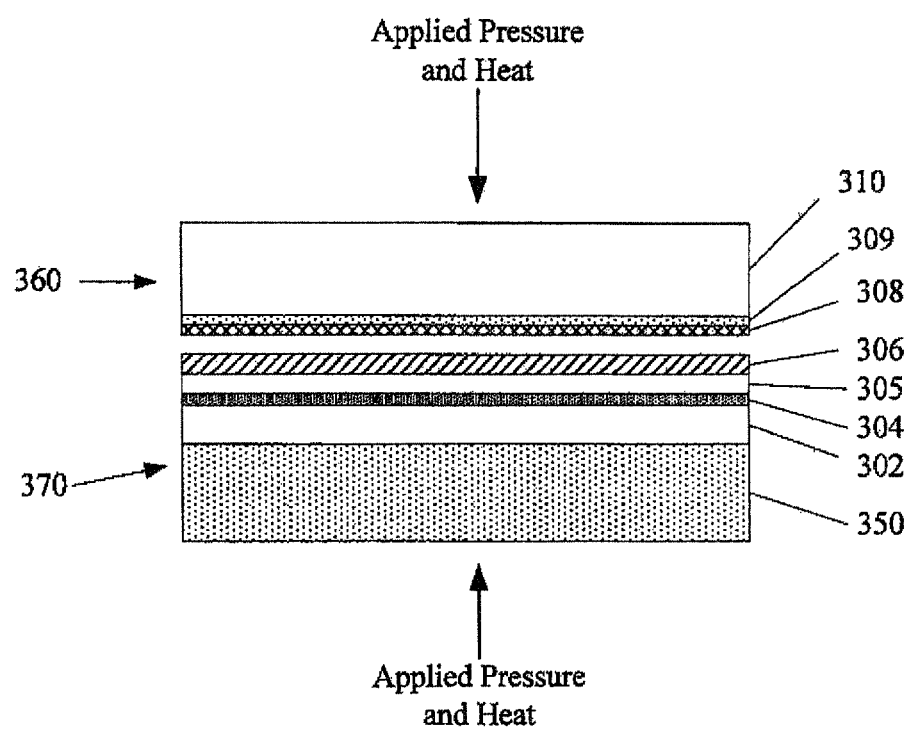
FIG. 17 is a third cross-sectional view showing the process of manufacture of the coplanar thin-film LED of the second configuration.

FIGS. 15-23 are cross-sectional views showing a process of manufacture of the coplanar thin-film LED of the second configuration. As shown in FIG. 15, an epitaxial structure including an n-type GaN-based layer 302, an active region 304, and a p-type GaN-based layer 305 are grown/formed on the sapphire or silicon carbide (SiC) substrate 350. As shown in FIG. 16, a reflective p-type contact/electrode 306 with a capping layer (e.g., Au) is formed on the p-type GaN-based layer 305 to cover an entire surface of the p-type GaN-based layer 305. Subsequently, as shown in FIG. 17, in a wafer bonding process, an insulating or electrically conductive substrate 310 with an insulating dielectric film layer 309 and an adhesive layer 308 is bonded through applied pressure to the reflective p-type electrode 306. The adhesive layer 308 may be eutectic metal, solder metal, or the like. Pressure is applied to put the two wafer surfaces 306, 308 in intimate contact. Heat may be provided to melt the adhesive layer 308 to join the two wafers 360, 370 together.

Figure 18:
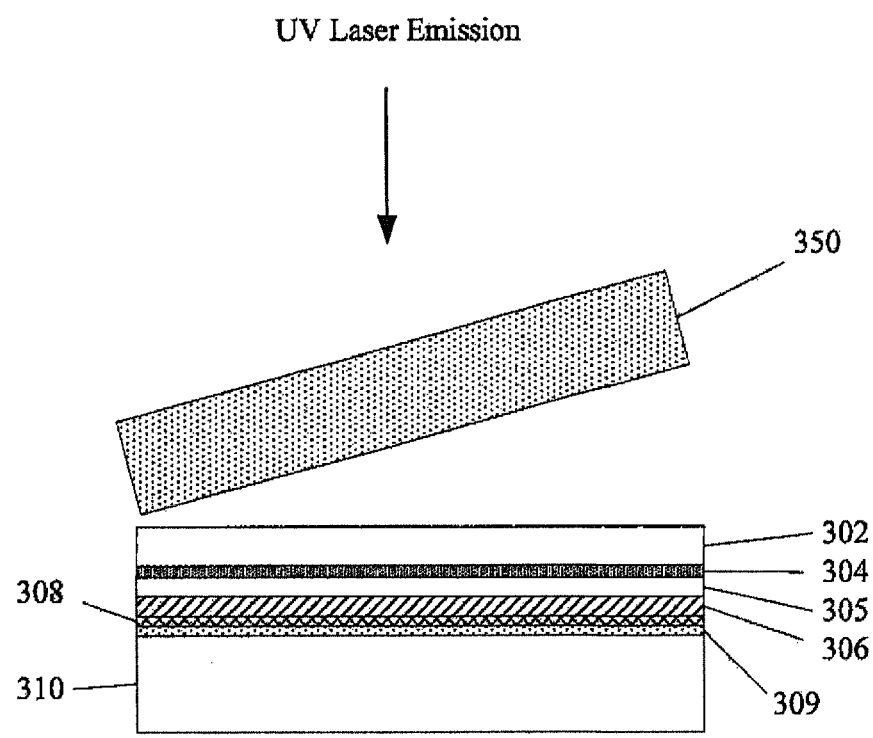
FIG. 18 is a fourth cross-sectional view showing the process of manufacture of the coplanar thin-film LED of the second configuration.
Figure 19:
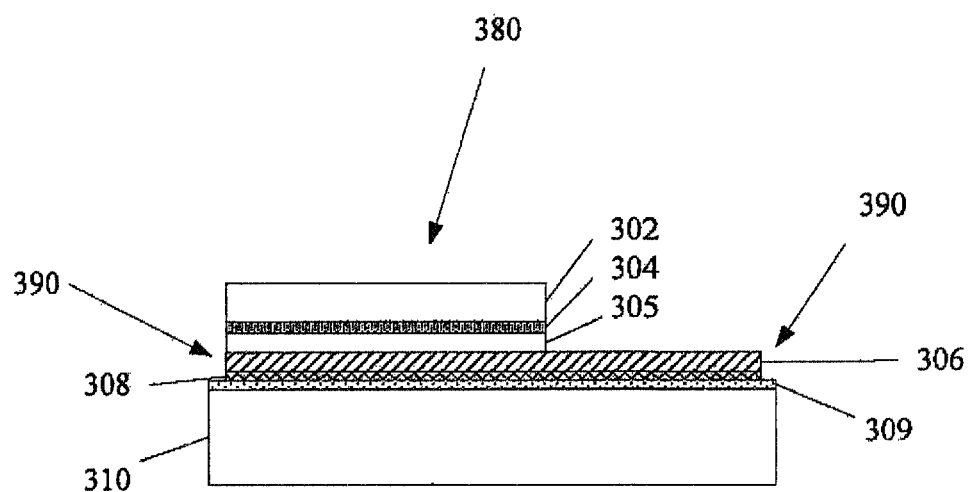
FIG. 19 is a fifth cross-sectional view showing the process of manufacture of the coplanar thin-film LED of the second configuration.
Figure 20:
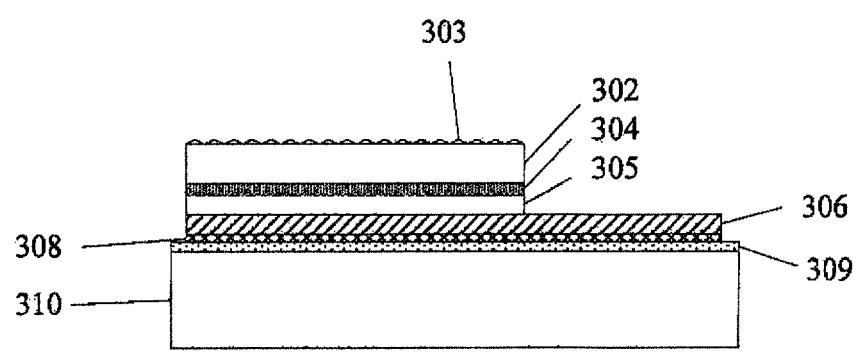
FIG. 20 is a sixth cross-sectional view showing the process of manufacture of the coplanar thin-film LED of the second configuration.
Figure 21:
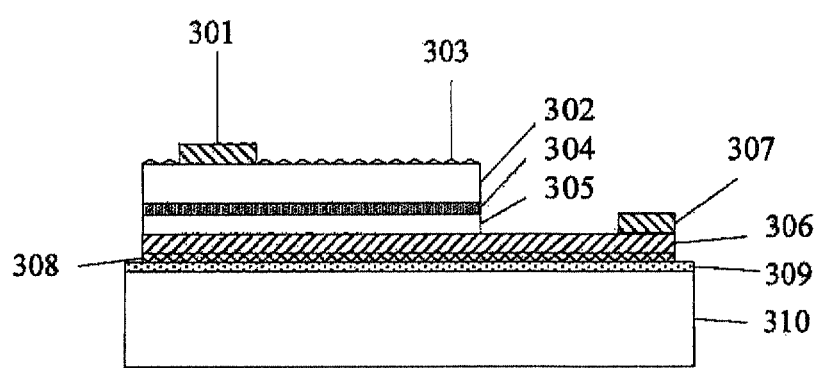
FIG. 21 is a seventh cross-sectional view showing the process of manufacture of the coplanar thin-film LED of the second configuration.
Figure 22:
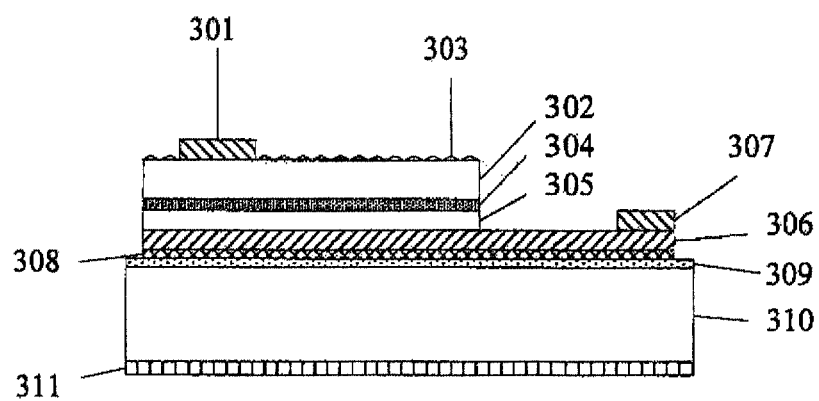
FIG. 22 is an eighth cross-sectional view showing the process of manufacture of the coplanar thin-film LED of the second configuration.
Figure 23:
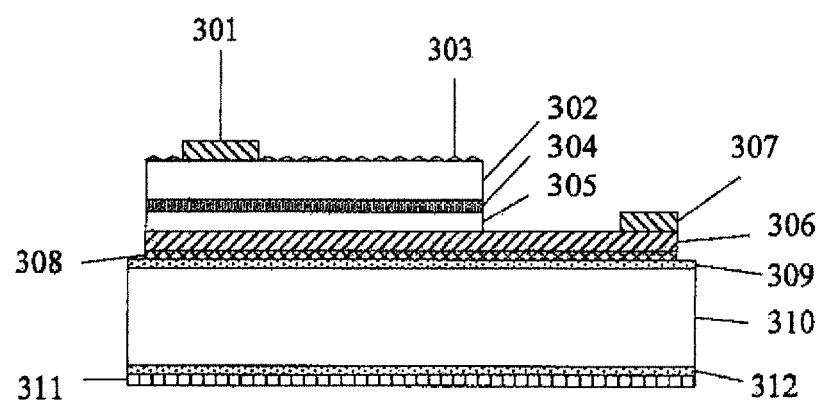
FIG. 23 is a ninth cross-sectional view showing the process of manufacture of the coplanar thin-film LED of the second configuration.

As shown in FIG. 18, the growth substrate 350 is removed. If the growth substrate 350 is a sapphire substrate, the growth substrate 350 may be removed through a laser lift-off (LLO) process in which a UV laser with a photon energy greater than the GaN band gap energy is applied. In an exemplary configuration, a UV laser with a wavelength of about 248 nm is used in the LLO process. If the growth substrate 350 is a SiC substrate, the growth substrate 350 may be removed through mechanical thinning and chemical etching. As shown in FIG. 19, a mesa 380 is formed by etching the epitaxial structure (i.e., the n-type GaN-based layer 302, active region 304, and the p-type GaN-based layer 305) to expose the reflective p-type electrode 306. In addition, recesses 390 are formed in the reflective p-type electrode 306 and conductive adhesive layer 308 to recess the current spreading layer (306+308) from the edge of the chip to avoid metal debris shoring the p-contact of the LED to the substrate 310 during the die singulation process. As shown in FIG. 20, a surface of the n-type GaN-based layer 302 is roughened with wet chemistry to create micro-structures 303 for enhanced light extraction efficiency. In an exemplary configuration, the micro-structures 303 are between about 200 nm and 400 nm in size. In another exemplary configuration, the micro-structures 303 are between about 100 nm and 500 nm in size. As shown in FIG. 21, the n-contact 301 is formed on the n-type GaN-based layer 302 and the p-contact 307 is formed on the reflective p-type electrode 306. If the p-type electrode 306 is not fully exposed when the epitaxial structure is etched and a thin layer of the p-Type GaN-based layer 305 remains, the p-contact 307 may be formed on the exposed p-type GaN-based layer 305. The n-contact 301 and the p-contact 307 are metal and may be Cr, Ti, aluminum, platinum, Au or the like. Subsequently, the substrate 310 is thinned to a desired thickness and, as shown in FIG. 22, the metalized bottom surface 311 is deposited on a bottom surface of the substrate 310. As shown in FIG. 23, an additional insulating dielectric film layer 312 may be formed on the bottom surface of the substrate 310 and the metalized bottom surface 311 may be deposited on the insulating dielectric film layer 312.

Figure 24:
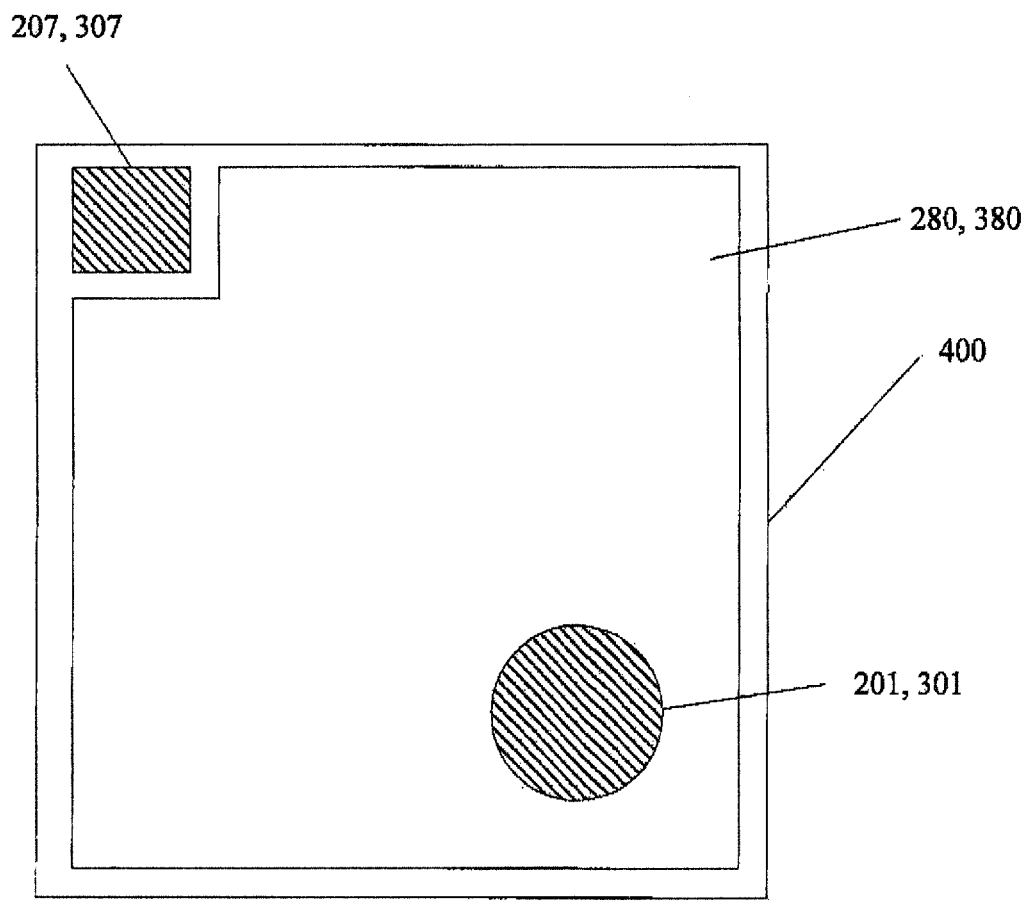
FIG. 24 is a top view showing a first example of the coplanar thin-film LED of the first and second configurations.
Figure 25:
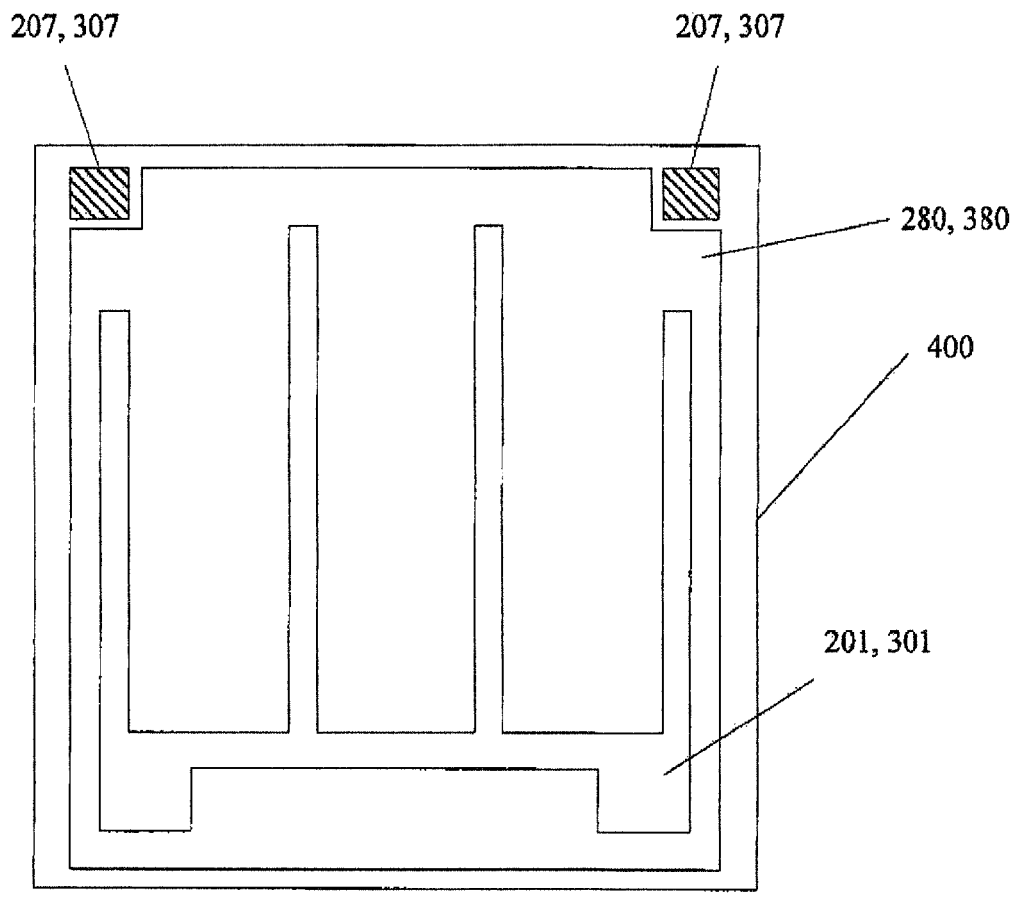
FIG. 25 is a top view showing a second example of the coplanar thin-film LED of the first and second configurations.

FIG. 24 is a top view showing a first example of a small coplanar thin-film LED of the first and second configurations. As shown in FIG. 24, the n-contact 201, 301 is circular and is formed on the mesa 280, 380. The p-contact 207, 307 is formed at a corner of the die, adjacent to the edge of the die 400. As demonstrated in FIG. 25, the shape of the n-contact 201, 301 is not limited to the illustrated electrode pattern and there may be more than one p-contact. FIG. 25 is a top view showing a second example of the coplanar thin-film LED of the first and second configurations. As shown in FIG. 25, the n-contact 201, 301 is formed with four fingers and a crossbar on the mesa 280, 380. The p-contacts 207, 307 are formed at corners of the die, adjacent to the edge of the die 400.

The various aspects of this disclosure are provided to enable one of ordinary skill in the art to practice the present invention. Modifications to various aspects of a coplanar thin-film LED presented throughout this disclosure will be readily apparent to those skilled in the art, and the concepts disclosed herein may be extended to other applications. Thus, the claims are not intended to be limited to the various aspects of a coplanar thin-film LED presented throughout this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A thin-film light emitting diode, comprising:
a substrate;
an insulating dielectric film layer on the substrate;
a reflective electrode disposed on the insulating dielectric film layer via a conductive adhesive layer, wherein the conductive adhesive layer and the reflective electrode comprises metal and together form a metallic current spreading layer; and
an epitaxial structure on the reflective electrode.

2. The thin-film light emitting diode of claim 1, wherein the substrate is electrically conductive.

3. The thin-film light emitting diode of claim 1, wherein the substrate is an insulator.

4. The thin-film light emitting diode of claim 1, wherein the metallic current spreading layer having a thickness greater than about 1 um.

5. The thin-film light emitting diode of claim 1, wherein the reflective electrode and conductive adhesive layer are recessed from an edge of the thin-film light emitting diode.

6. The thin-film light emitting diode of claim 1, further comprising a metal layer on a bottom surface of the substrate.

7. The thin-film light emitting diode of claim 1, further comprising: a second insulating dielectric film layer on a bottom surface of the substrate; and a metal layer on the second insulating dielectric film layer.

8. The thin-film light emitting diode of claim 1, further comprising a metal contact coupled to the electrode.

9. The thin-film light emitting diode of claim 8, wherein the metal contact is on the electrode.

10. The thin-film light emitting diode of claim 1, wherein the substrate is reflective for the wavelength between about 300 nm and 700 nm with a reflectance greater than about 50%.

11. The thin-film light emitting diode of claim 1, wherein the substrate is transparent for the wavelengths between about 300 nm and 700 nm with a transmittance greater than about 50%.

12. The thin-film light emitting diode of claim 1, wherein the epitaxial structure comprises a first epitaxial layer, a second epitaxial layer, and an active region between the first epitaxial layer and the second epitaxial layer.

13. The thin film light emitting diode of claim 12, wherein the first epitaxial layer has a roughened surface with micro-structures, the micro-structures being between about 100 nm and 500 nm in size.

14. The thin-film light emitting diode of claim 12, wherein the first epitaxial layer is an n-type GaN-based layer and the second epitaxial layer is a p-type GaN-based layer.

15. The thin-film light emitting diode of claim 12, further comprising a patterned second electrode on the first epitaxial layer.

16. The thin-film light emitting diode of claim 15, wherein the epitaxial structure is formed to be a mesa on the electrode and the patterned second electrode is on a top surface of the mesa.

17. The thin-film light emitting diode of claim 1, wherein the substrate is not an original growth substrate for the epitaxial structure.

* * * * *